(12) United States Patent  
Bernstein et al.

(10) Patent No.: US 6,645,789 B2
(45) Date of Patent: Nov. 11, 2003

(54) ON CHIP ALPHA-PARTICLE DETECTOR

(75) Inventors: Kerry Bernstein, Underhill, VT (US); Andres Bryant, Essex Junction, VT (US); Wayne J. Howell, Williston, VT (US); William A. Klaasen, Underhill, VT (US); Wilbur D. Pricer, Charlotte, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/246,136

(22) Filed: Sep. 18, 2002

(65) Prior Publication Data

US 2003/0020128 A1 Jan. 30, 2003

Related U.S. Application Data

(62) Division of application No. 09/614,234, filed on Jul. 12, 2000.

(51) Int. Cl.[7] .................................................. H01L 21/00
(52) U.S. Cl. ................. 438/57; 438/5; 257/59; 257/751; 257/758; 257/762; 257/763; 257/764; 257/767
(58) Field of Search .......................... 257/59, 751, 758, 257/762, 763, 764, 767; 438/5

(56) References Cited

U.S. PATENT DOCUMENTS

| | | |
|---|---|---|
| 4,528,212 A | 7/1985 | Cairns et al. |
| 4,868,420 A | 9/1989 | Itoh et al. |
| 5,194,930 A | 3/1993 | Papathomas et al. |
| 5,212,385 A | 5/1993 | Jones |
| 5,491,339 A | 2/1994 | Mitsui et al. |
| 5,331,164 A | 7/1994 | Buehler et al. |
| 5,338,963 A | 8/1994 | Klaasen et al. |
| 5,637,185 A * | 6/1997 | Murarka et al. ............. 438/5 |
| 5,666,007 A * | 9/1997 | Chung ...................... 257/751 |
| 5,854,506 A | 12/1998 | Fallica |
| 5,965,945 A | 10/1999 | Miller et al. |
| 6,144,103 A | 11/2000 | Miller et al. |
| 6,210,981 B1 | 4/2001 | Birdsley et al. |

* cited by examiner

Primary Examiner—David Nelms
Assistant Examiner—Mai-Huong Tran
(74) Attorney, Agent, or Firm—Scully, Scott, Murphy & Presser; Mark F. Chadurjian

(57) ABSTRACT

An IC chip comprising, a nearby or remote source capable of particle emissions; circuitry formed in the IC chip that is adversely affected by impacts of particle emissions from said source; and a particle detector formed in the IC chip between the circuitry and source for detecting said particle emissions. In one embodiment of the present invention, the source comprises a solder ball that is formed on a surface of the IC chip, and the solder ball is capable of emitting alpha-particles. The particle emissions detector of the present invention is a reverse biased Schottky diode. The IC chip is formed by (a) providing an IC chip having at least one layer of particle sensitive circuitry formed therein; (b) forming another layer having at least one particle sensor region situated therein on a surface of said IC chip; and (c) optionally, forming at least one particle emission source over said another layer.

8 Claims, 3 Drawing Sheets

ON CHIP ALPHA-PARTICLE DETECTOR

RELATED APPLICATIONS

This application is a divisional of U.S. application Ser. No. 09/614,234, filed Jul. 12, 2000.

TECHNICAL FIELD

The present invention relates to integrated circuit (IC) chips, and more particularly to an IC chip which includes an on chip detector that is capable of detecting particle emissions, e.g., alpha-particle emissions, from a nearby and/or distant particle emission source. The present invention also relates to a method of fabricating an IC chip which includes an on chip particle emission detector as one of the components of the chip.

BACKGROUND OF THE INVENTION

The primary sources of alpha-particles in many IC chips are the solder balls such as C4 solder balls (Control Collapse Chip Connectors) used to connect the IC chip to an external substrate such as a-ceramic package. In such cases, the alpha-particles must pass through the back end of the line (BEOL) of the IC chip to reach bulk silicon present therein. When an alpha-particle reaches the silicon, it will generate free electron-hole pairs in the silicon causing an electronic noise burst.

This electronic noise burst, in turn, may be detected by part of the IC chip and may be mistaken for a logic signal thereby leading to an error, which is oftentimes referred to in the art as a "soft-fail". This impingement of alpha-particles and eventual soft-fail problem has become more pronounced as the dimensions of the IC chips have been reduced.

In some circumstances, this soft-fail caused by alpha-particles leads to data corruption in or passing through logic circuits. By detecting alpha-particles passing through the BEOL, instances of soft-fail can be detected and the information so gathered may then be used to predict when failures may occur.

Although fail detection is well known and relatively simple for arrays of memory cells such as DRAM (Dynamic Random Access Memory), it is still very difficult, in terms of design, complexity, circuit area and performance impact, to detect soft-fails in logic circuits. It is however desirable to detect soft-fails in logic circuits to eliminate corrupt data, either by detecting it before soft-fail occurs or by destroying the data. In addition, recovery circuits or operations can be invoked such that the system containing the IC chip continues to run seamlessly.

In view of the above remarks, there is a continued need to develop a new and improved IC chip in which alpha-particles as well as other radiative particles can be quickly and easily detected so that soft-fail and other like errors can be determined, predicted and thus eventually eliminated. It would be extremely beneficial if a radiative particle detector could be fabricated as part of the IC chip itself so as to avoid substantially increasing the size of the IC package.

SUMMARY OF THE INVENTION

One object of the present invention is to provide an IC chip in which an on chip particle detector is formed between a particle emission source and circuitry in the chip that is adversely affected by impacts of particle emissions from the particle emission source.

Another object of the present invention is to provide an IC chip having a particle emission detector formed in the IC chip wherein said detector is capable of detecting particle emissions from a nearby and/or distant source as well as being able to output a signal to warn a user that particle emissions have been detected in the IC chip. This would allow a user to stop the use of the system containing the IC chip thereby permitting the system to recover from a potential soft-fail error.

A further object of the present invention is to provide a simple and relatively inexpensive method of fabricating an IC chip which contains an on chip particle emission detector as one of the integral components of the IC chip.

A still further object of the present invention is to use existing methods that are typically used in manufacturing and packaging of IC chips.

One aspect of the present invention relates to an IC chip which comprises an on chip particle emission detector that is capable of achieving the above and other objects. The on chip particle emission detector of the present invention is formed in the various wiring levels of the IC chip between the particle emission source and circuitry in the IC chip that is sensitive to particle emission. Specifically, in one embodiment of the present invention, the IC chip comprises:

at least one source capable of particle emissions;

circuitry formed in the IC chip that is adversely affected by impacts of particle emissions from said source; and a particle detector formed in the IC chip between the circuitry and particle emission source for detecting particle emissions.

The particle detector of the present invention is a reverse biased Schottky diode that consists of a polysilicon layer having a depletion region formed therein and a patterned metal layer that is formed over the polysilicon layer.

In yet another embodiment of the present invention, the particle emission source comprises a lead solder ball that is formed on a surface of the IC chip, and the solder ball is capable of emitting alpha-particles.

In still another embodiment of the present invention, the particle emission detector is connected to a sense and bias circuit that is capable of monitoring the IC chip during use. The sense circuit may provide a signal when the particle detector senses a radiative particle thereby for the stoppage of the system containing the IC chip.

In an even further embodiment of the present invention, the source of particle emissions is remote, i.e., distant, from the IC chip. This embodiment of the present invention is typically employed in cases wherein cosmic ray collisions, gamma rays and photon bursts are to be detected. In such an embodiment, the source of particle emissions is not built into the IC chip. Instead, it is some remote distant therefrom, yet the particles so emitted are capable of reaching an IC chip of the present invention and affecting it in the manner indicated above.

In other aspect of the present invention, a method of fabricating the above mentioned IC chip is provided. Specifically, the method of fabricating the inventive IC chip comprises the steps of:

(a) providing an IC chip having at least one layer of particle sensitive circuitry formed therein;

(b) forming another layer having at least one particle sensor region situated therein on a surface of said IC chip; and (c) optionally, forming at least one particle emission source-over said another layer.

DETAILED DESCRIPTION OF THE INVENTION

Figure 1A:
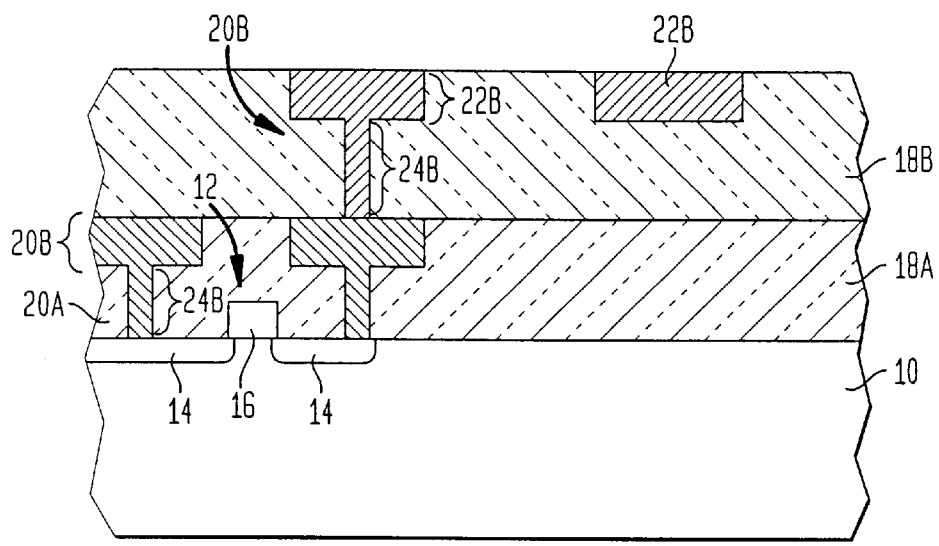
FIGS. 1A–D are cross-sectional views showing the basic processing steps of the present invention which are used in forming an IC chip having an on chip particle detector formed therein.

The present invention, which is directed to an IC chip having an on chip particle emission detector and a method of fabricating the same, will now be described in greater detail by referring to the drawings that accompany the present application. It should be noted that in the accompanying drawings like and/or corresponding elements are referred to by like reference numerals.

Reference is first made to FIGS. 1A–D which are cross-sectional views of an IC chip during the various processing steps of the present invention. Specifically, FIG. 1A shows an initial IC chip that is employed in the present invention. The initial IC chip comprises a substrate 10 which includes an active device region 12 formed thereon. It is noted that the active device present in the initial structure is sensitive to radiative particles. As is shown in FIG. 1A, the active device region is a MOSFET that includes diffusion regions 14 and a gate region 16. Although the drawings of the present invention depict the presence of a MOSFET region on the substrate, the substrate may contain other active device regions, i.e., circuitry, such as bipolar junction transistors that are sensitive to radiative particles such as alpha-particles, gamma rays, cosmic rays or photon bursts. Moreover, although only one active device region is shown in the drawings of the present invention, a plurality of active device regions may be present in the IC chip.

The initial IC chip further includes interlevel dielectric (ILD) layers 18A and 18B, each ILD layer has wiring regions 20 comprising metallic lines 22 and vias 24 formed therein. As shown in FIG. 1A, the wiring regions in ILD layer 18A are in contact with the diffusion regions of the active device. Although the drawings show the presence of two ILD layers, the invention is not limited to an IC chip which contains two ILD layers. Instead, the present invention works in any IC chip which includes at least one ILD layer.

The structure shown in FIG. 1A is fabricated using conventional IC chip processing steps that are well known in the art. Since such techniques are well known in the art, a detailed description of the same is not provided herein. Moreover, the materials used in fabricating the IC structure of FIG. 1A are also conventional. For example, substrate 10 of the illustrated structure is composed of, or contains, any semiconducting material including, but not limited to: Si, Ge, SiGe, GaAs, InAs, InP and all other III/V semiconductor compounds. Layered substrates comprising the same or different semiconductor material, e.g., Si/SiGe, and silicon-on-insulators (SOIs) are also contemplated herein.

Interlevel dielectric layers 18A and 18B are formed by utilizing a conventional deposition process such as, but not limited to: chemical vapor deposition (CVD), plasma-assisted CVD, sputtering, spin-on coating, dip coating and other like deposition processes. Interlevel dielectric layers 18A and 18B may be composed of the same or different dielectric material including, but not limited to: $SiO_2$, $Si_3N_4$, polyimides, polyamides, diamond, diamond-like carbon, silicon-containing polymers and other like inorganic or organic dielectric materials.

The wiring regions which are also sensitive to radiative particles are formed in the interlevel dielectric layers by opening vias and/or lines utilizing conventional lithography and etching (reactive-ion etching (RIE)) and then depositing a conductive metal or metal alloy in the vias and/or lines. Conventional damascene processes may also be used in forming the wiring regions. Suitable conductive metals include, but are not limited to: Cu, W, Al, Au, Ag and Cr. The conductive metals or metal alloys formed in the vias and/or lines may be the same or different. Moreover, the conductive metal or metal alloys are deposited utilizing conventional deposition processes such as CVD, plasma-assisted CVD, sputtering, plating, evaporation and other like deposition processes.

Although not shown in the drawings, a liner may be formed in the vias and/or lines prior to deposition of the conductive metals or metal alloys. When such an embodiment is employed, any deposition process capable of forming a conformal liner in the vias and/or lines may be employed. Moreover, any material such as $Si_3N_4$ that can prevent diffusion of metal ions into the surrounding dielectric layer can be used as the liner for vias and/or lines. Moreover, when the ILD layers are composed of different dielectrics, a diffusion barrier may be formed between the ILD layers.

A conventional planarization process such as chemical-mechanical polishing (CMP) or grinding may be employed to provide the planarized IC structure shown in FIG. 1A. It is noted that the structure shown in FIG. 1A represents one kind of structure that can be employed in the present invention. Other IC structures that include at least a region of particle sensitive circuitry formed therein are also contemplated in the present invention. It is noted that the MOSFET and wiring regions of the IC chip are types of circuitry that are sensitive to radiative particles.

Figure 1B:
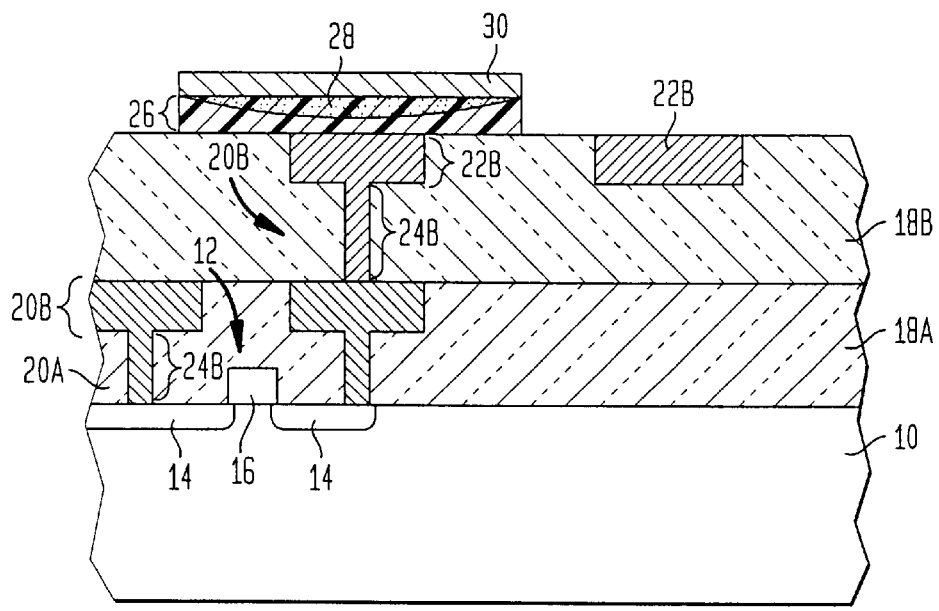

After providing an IC chip structure such as shown in FIG. 1A, a polysilicon layer 26 having at least one particle sensor region 28 situated therein is formed over the IC chip, See FIG. 1B, in a region so that the wiring region of ILD layer 18B is in contact with polysilicon layer 26. In the present invention, particle sensor region 28 is a depletion region formed in the polysilicon layer. Polysilicon layer 26 and region 28 can be formed by either depositing lightly doped polysilicon layer on the surface of the IC chip and thereafter forming the depletion region by ion implantation and activation annealing, or alternatively, polysilicon layer 26 and region 28 can be formed in one step utilizing a conventional in-situ doping deposition process.

Notwithstanding which technique is used in creating polysilicon layer 26 and region 28, the doping should be such that at least about 0.5 $\mu$m of the polysilicon layer is depleted. More preferable, the doping should be such that about 0.5 to about 1.5 $\mu$m of the polysilicon layer is depleted. Although the thickness of the polysilicon layer is not critical to the present invention, the polysilicon layer typically has a thickness of from about 0.5 $\mu$m to about 5.0 $\mu$m, with a thickness of from about 1.0 $\mu$m to about 2.0 $\mu$m being more preferred.

After forming polysilicon layer 26 and region 28, a patterned metal layer 30 (See, FIG. 1B) is formed on the polysilicon layer utilizing conventional deposition processes (including the same used in forming the metallic lines and vias) and etching, i.e., RIE or another like etching process. The patterned metal layer is composed of the same or different conductive metals (or metal alloys) as were previously used above in forming the metallic lines and vias, with Cu and Al being highly preferred. In the present invention, the patterned metal layer comprises a series of metallic lines.

Figure 1C:
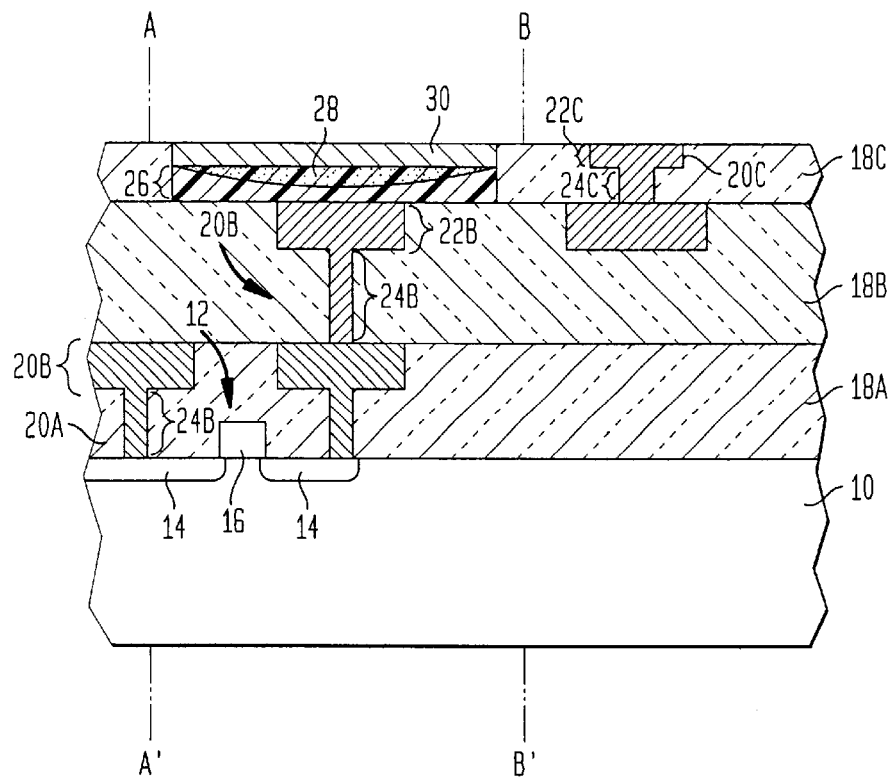
Figure 2:
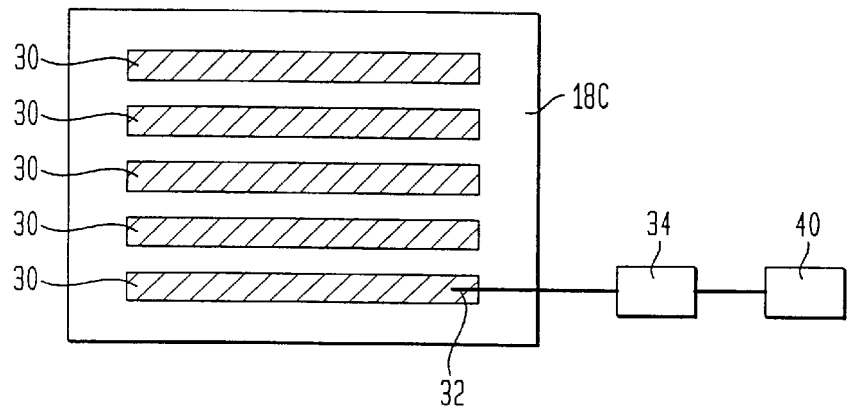
FIG. 2 is a top view illustrating of the structure shown in FIG. 1E through cuts A–A[1] and B–B[1].

ILD layer 18C is then formed so as to abut elements 26, 28 and 30 utilizing one or the previous mentioned desposition processes. Alternatively, ILD layer 18C may be formed first, and thereafter elements 26, 28 and 30 are formed by first opening a hole (by lithography and etching) in ILD layer 18C and thereafter forming elements 26, 28 and 30 as described above. Notwithstanding which technique is employed, a planar structure such as shown in FIG. 1C is formed. FIG. 2 shows a top view of the IC structure illustrated in FIG. IC through cut A–A' and B–B'l. It is noted that polysilicon layer 26, depletion region 28 (not shown in FIG. 2) and patterned metal layer 30 form the on chip detector of the present invention.

Specifically, the on chip detector of the present invention is a Schottky diode that consists of polysilicon layer 26, depletion region 28 and patterned metal layer 30. Although only one detector is shown in the drawings of the present invention, a plurality of the same are also contemplated herein.

A wiring region 20C including a metal line 22C and via 24C is formed in the ILD layer 18C so that a contact is made to metal line 22B in ILD layer 18B.

Figure 3:
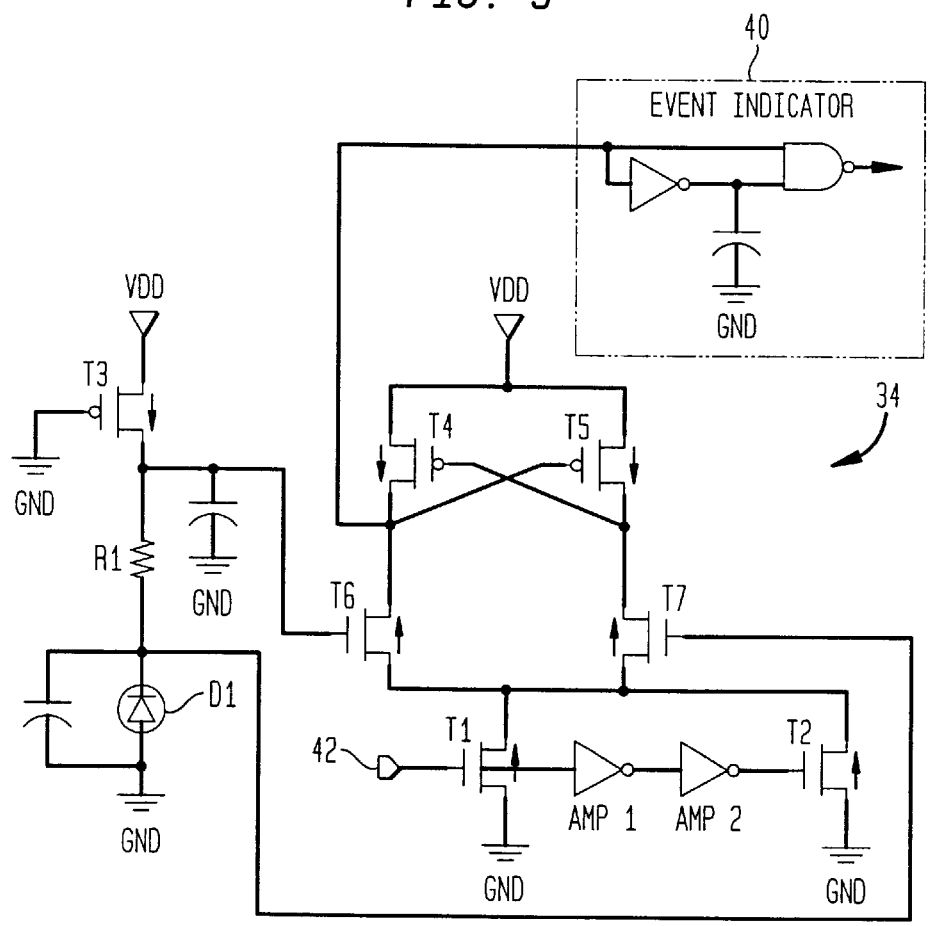
FIG. 3 is a schematic of a typical detector/bias circuit that can be employed in the present invention.

FIG. 2 also shows a contact 32 formed at one of the patterned metal layers which is connected to a sense and bias circuit 34. Although contact is shown only at one patterned metal layer, each patterned metal layer of the detector of the present invention would be connected in the manner indicated above. FIG. 3 shows a sense and bias circuit 34 which may optionally include conventional output circuitry 40 for permitting a user to detect changes in the detector caused by the impact of radiative particles such as alpha-particles, cosmic rays, gamma rays and photons on the sensor region of the detector. The sense and bias circuit includes a series of PFETs T3, T4 and T5, NFETs T1, T2, T6 and T7, a sense clock 42 and amplifiers Amp 1 and Amp 2. One end of the detector of the present invention (labeled as D1) is connected to a power supply, VDD, through parasitic interconnect resistor R1 and transistor T3, and the other end of D1 is connected to ground, GND.

The detector of the present invention is an ionizing radiation detector consisting of a reverse biased Schottky diode embedded in an ILD layer. An alpha-particle or other like particle generates a current pulse in the Schottky diode which is sensed by the sensor circuit and converted to a digital signal output from the sensing circuit. This signal can be used to temporarily halt the chip operation and implement remedial action based on a technique called "journaling" in which partial results are stored for future reference in the event of system error. Thus, allowing the system to recover from a potential soft-fail error.

Figure 1D:
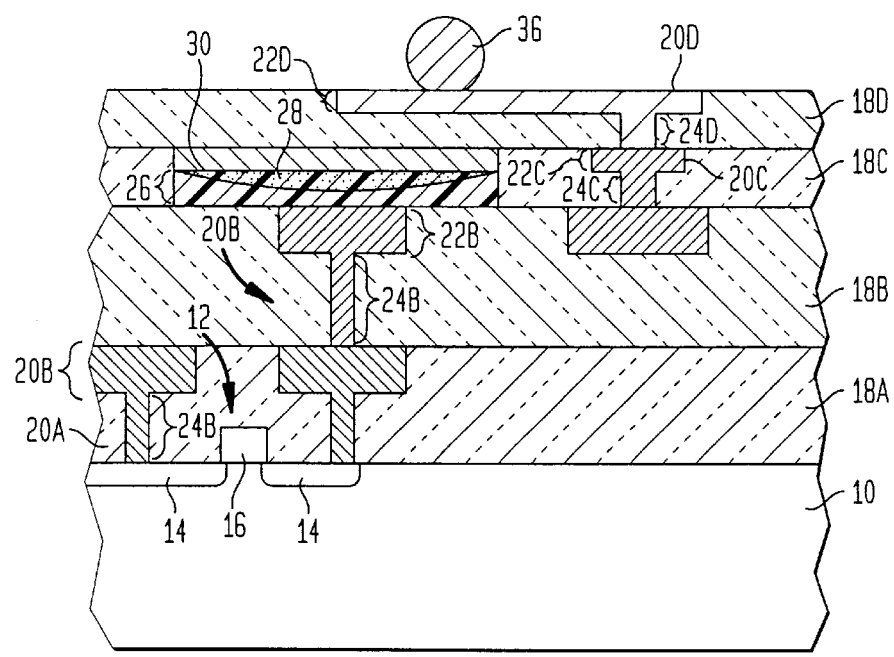

Next, as shown in FIG. 1D, another ILD layer 18D is formed on the surface of ILD 18C utilizing one of the previously mentioned deposition processes. ILD layer 18D includes a metal line 22D and a via 24D formed therein.

A solder ball 36 or another means for connecting the IC chip to an external substrate (not shown) is then formed over the detector of the present invention utilizing conventional techniques well known to those skilled in the art. A preferred solder ball is a C4 solder ball which is formed in accordance with U.S. Pat. Nos. 3,429,040 and 3,410,055, the contents of which are incorporated herein by reference. Other solder balls preferably containing lead are also contemplated herein.

In the drawings of the present invention, solder ball 36 represents the source of alpha-particle emissions. Although only one solder ball is depicted, a plurality of solder balls may be formed in the structure. When a plurality of solder balls are present, an on chip detector may be formed under each of the solder balls or only under some of the solder balls.

As mentioned above, the on chip detector of the present invention can also be used to detect cosmic ray byproducts, gamma rays or photons bursts. These other particles may be detected with the alpha-particles or alternatively by themselves.

When detection of cosmic rays, gamma rays or photons is desired, the IC chip need not include solder balls 36. Instead, in those cases, the source of particle emissions is typically remote from the IC chip, yet the particles to be detected are capable of traveling to said IC chip. In such embodiments, the IC chip shown in FIG. 1C or 1D with or without a solder ball can be employed.

While this invention has been particularly shown and described with respect to preferred embodiments thereof, it will be understood by those skilled in the art that the foregoing and other changes in forms and details may made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A method of fabricating an IC chip having an on chip particle detector comprising the steps of:
    providing an IC chip having at least one layer of particle sensitive circuitry formed therein; and
    forming another layer having at least one particle sensor region situated therein on a surface of said IC chip.

2. The method of claim 1 wherein said circuitry is formed in a semiconductor substrate.

3. The method of claim 1 wherein said circuitry comprises MOSFETs, bipolar transistors, wiring regions or combinations thereof.

4. The method of claim 1 wherein said another layer having at least one particle sensor region is formed by deposition and ion implantation or an in-situ-doping deposition process.

5. The method of claim 1 wherein said another layer includes a patterned metal layer formed above said at least one particle sensor region.

6. The method of claim 1 further comprising forming at least one particle emission sensor over said another layer.

7. The method of claim 6 wherein said source comprises a lead solder ball formed on a surface of the IC chip.

8. The method of claim 1 wherein said another layer comprises a polysilicon layer and said at least one particle sensor region comprises a depletion region.

* * * * *